(12) United States Patent
Nakamura et al.

(10) Patent No.: US 9,529,039 B2
(45) Date of Patent: Dec. 27, 2016

(54) SEMICONDUCTOR TRANSPORTING AND TESTING FIXTURE

(75) Inventors: Shinichi Nakamura, Tokyo (JP); Fumiaki Nanami, Tokyo (JP)

(73) Assignee: UNITECHNO, INC., Tokyo (JP)

( * ) Notice: Subject to any disclaimer, the term of this patent is extended or adjusted under 35 U.S.C. 154(b) by 208 days.

(21) Appl. No.: 14/399,829

(22) PCT Filed: May 10, 2012

(86) PCT No.: PCT/JP2012/003058
§ 371 (c)(1),
(2), (4) Date: Nov. 7, 2014

(87) PCT Pub. No.: WO2013/168196
PCT Pub. Date: Nov. 14, 2013

(65) Prior Publication Data
US 2015/0123686 A1     May 7, 2015

(51) Int. Cl.
*G01R 31/20*     (2006.01)
*G01R 31/28*     (2006.01)
(Continued)

(52) U.S. Cl.
CPC ......... *G01R 31/2893* (2013.01); *G01R 1/0466* (2013.01); *G01R 1/06705* (2013.01); *G01R 31/2601* (2013.01)

(58) Field of Classification Search
CPC ....... G01R 1/04; G01R 1/0408; G01R 1/0433; G01R 1/0491; G01R 1/06744; G01R 1/073; G01R 1/07342; G01R 31/2601; G01R 31/2886; G01R 31/2887; G01R 31/2891
See application file for complete search history.

(56) References Cited

U.S. PATENT DOCUMENTS 6,069,482 A * 5/2000 Hilton ................. G01R 1/0483
324/755.08
7,151,368 B2 * 12/2006 Joung ................. G01R 1/0408
324/757.01
(Continued)

FOREIGN PATENT DOCUMENTS

CN     101825650 A     9/2010
JP     2001-116795 A    4/2001
(Continued)

OTHER PUBLICATIONS

International Search Report of PCT/JP2012/003058.

*Primary Examiner* — Tung X Nguyen
(74) *Attorney, Agent, or Firm* — Venable LLP; Henry J. Daley

(57) ABSTRACT

The semiconductor transporting and testing fixture according to the present invention comprises: a frame portion (21) adapted to receive therein an IC (5) having an external connection terminal, the frame portion having an inner peripheral wall; a bottom surface sheet (25) pasted on a bottom surface of the frame portion, the bottom surface sheet having an IC side pad (26) formed on a front surface thereof and a socket side pad (27) formed on a rear surface thereof, the IC side pad being adapted to contact the external connection terminal, the socket side pad electrically connected with the corresponding IC side pad and being adapted to contact a testing socket, wherein the frame portion (21) is provided with a retaining latch (23) protruding therefrom toward above the IC (5) when the IC (5) is received in the inner peripheral wall (22) of the frame portion (21).

5 Claims, 7 Drawing Sheets

(51) Int. Cl.
*G01R 1/04* (2006.01)
*G01R 1/067* (2006.01)
*G01R 31/26* (2014.01)

(56) References Cited

U.S. PATENT DOCUMENTS

2006/0091524 A1  5/2006  Karashima et al.
2009/0206857 A1  8/2009  Chiang
2010/0163869 A1  7/2010  Yang et al.

FOREIGN PATENT DOCUMENTS

| JP | 2001-272435 A | 10/2001 |
| JP | 2005-121604 A | 5/2005 |
| JP | 2006-134912 A | 5/2006 |
| JP | 2009139370 A | 6/2009 |
| JP | 2010266344 A | 11/2010 |
| JP | 2011116795 A | 6/2011 |
| TW | 386640 U | 4/2000 |
| TW | 201037314 A | 10/2010 |
| WO | WO-2010004844 A1 | 1/2010 |

* cited by examiner

US 9,529,039 B2

SEMICONDUCTOR TRANSPORTING AND TESTING FIXTURE

CROSS-REFERENCES TO RELATED APPLICATION

This application is a United States national phase application of co-pending international patent application number PCT/JP2012/003058, filed on May 10, 2012, disclosure of which is incorporated herein by reference in its entirety.

TECHNICAL FIELD

The present invention relates to a semiconductor transporting and testing fixture for transporting a semiconductor, and, more particularly, to a semiconductor transporting and testing fixture suitable for transporting and preliminarily testing a narrow-pitch BGA (Ball Grid Array) type semiconductor.

BACKGROUND ART

In recent years, the integration of a semiconductor integrated circuit (hereinafter simply referred to as "IC") has been further highly integrated, and accordingly, in applying an IC in a product, it is usually the case that a preliminary testing inclusive of a function testing, a burn-in testing and the like, is conducted prior to embedding the IC into a product. And, it is generally the case that the ICs are transported, and preliminarily tested in such a state that a transportation framework is mounted thereon with a plurality of semiconductor transporting and testing fixtures, each of which has an IC received therein.

Therefore, it is essential to secure a connection of an IC to be preliminarily tested and a semiconductor test device (hereinafter simply referred to as "IC tester") through the semiconductor transporting and testing fixture and a testing socket, so that the preliminary testing is rapidly conducted. Further, it is also essential to prevent the IC from dropping off the semiconductor transporting and testing fixture, because in a case that the IC drops off the semiconductor transporting and testing fixture during a transportation process, the IC tester must be stopped for manual repair action, thereby degrading an operating rate of the IC tester.

There have already been proposed various semiconductor transporting and testing fixtures applicable for a preliminary testing of ICs (See Patent Document 1 and 2).

To be more specific, a semiconductor transporting and testing fixture having a frame-shaped main body and disposed therein with a gripping mechanism (retaining latch) for gripping the IC by an upper surface and a bottom surface is disclosed in Patent Document 1. Further, a semiconductor transporting and testing fixture having a frame-shaped main body, disposed therein with a gripping mechanism (retaining latch) for gripping the IC by an upper surface and provided on a bottom portion of the main frame with a device sustaining portion for sustaining the IC is disclosed in Patent Document 2.

CITATION LIST

Patent Literature

Patent Document 1: Japanese Patent Publication No. 2009-139370

Patent Document 2: Japanese Patent Publication No. 2010-266344

SUMMARY OF INVENTION

Technical Problem

In recent years, a diameter and a pitch of an external connection terminal of the IC are more and more narrowed. Particularly, the pitch interval of the external connection terminal has been narrowed from conventional 1.0-0.65 mm to 0.5 mm or shorter in the BGA (Ball Grid Array) type semiconductor or a LGA (Land Grid Array) type semiconductor that employs a solder ball as the external connection terminal.

However, the external connection terminal of the IC and a contact pin of the testing socket for the preliminary testing are directly brought into contact with each other in the semiconductor transporting and testing fixtures disclosed in Patent Document 1 and Patent Document 2, so that there is such a technical problem that the pitch of the contact pin of the testing socket for the preliminary testing must be narrowed in response to the pitch of the external connection terminal being narrowed, thereby causing the rise in price of the testing socket. Further, the IC is gripped by the retaining latch or the thin device sustaining portion in the semiconductor transporting and testing fixtures disclosed in Patent Document 1 and Patent Document 2, so that there is such a technical problem that the ICs are likely to drop off during the transportation process.

The present invention has been made to overcome the previously mentioned technical problems, and it is therefore an object of the present invention to provide a semiconductor transporting and testing fixture that is capable of not only completely eliminating a risk of a dropping off an IC but also eliminating a necessity of narrowing the pitch of a testing socket for preliminary testing even in a case that the semiconductor transporting and testing fixture is applied to the ICs having narrow pitch external connection terminals.

Solution to Problem

The semiconductor transporting and testing fixture according to the present invention comprises: a frame portion adapted to receive therein a semiconductor integrated circuit having an external connection terminal, the frame portion having an inner peripheral wall; a bottom surface sheet pasted on a bottom surface of the frame portion, the bottom surface sheet having a first pad formed on a front surface thereof and a second pad formed on a rear surface thereof, the first pad being adapted to contact the external connection terminal, the second pad electrically connected with the corresponding first pad and being adapted to contact a testing socket, in which the frame portion is provided with a retaining latch protruding therefrom toward above the semiconductor integrated circuit when the semiconductor integrated circuit is received in the inner peripheral wall of the frame portion, the bottom surface sheet is formed in a multi-layer structure and has arranged therein a conduction passage having the first pad and the second pad connected with each other, the conduction passage being horizontally extended inside the bottom surface sheet.

By the construction as set forth above, the drop off of the ICs during the transportation process can be completely eliminated. Further, by the construction as set forth above, an arrangement interval of contact pins of the testing socket can be extended longer than an arrangement interval of the external contact terminals of the semiconductor integrated circuit, thereby making it possible to suppress a manufacturing cost of the testing socket.

The semiconductor transporting and testing fixture according to the present invention may preferably be so constructed that the bottom surface sheet is made of a material having flexibility.

By the construction as set forth above, the external connection terminal of the IC and the first pad can be securely contacted with each other, while the second pad and the testing socket can be securely contacted with each other.

The semiconductor transporting and testing fixture according to the present invention may preferably be so constructed that the first pad and the second pad are different from each other in a arrangement pattern.

By the construction as set forth above, a necessity of narrowing the pitch of the testing socket for the preliminary testing can be eliminated even in a case that semiconductor transporting and testing fixture is applied to the IC having a narrow pitch in the external connection terminal.

The semiconductor transporting and testing fixture according to the present invention may preferably be so constructed that the frame portion and the bottom surface sheet respectively have a positioning hole formed therein, the positioning hole being adapted to have fit therein a positioning pin which is disposed at a predetermined position suited for the testing socket.

By the construction as set forth above, the semiconductor transporting and testing fixture and the testing socket can be securely positioned.

The semiconductor transporting and testing fixture according to the present invention may preferably be so constructed that each of the first pads is formed in a shape selected from among a ring shape, a segmented shape, a circular shape and a polygonal pyramid shape.

By the construction as set forth above, a contactability of the external connection terminal of the IC and the first pad can be enhanced.

Advantageous Effect of Invention

The present invention can provide a semiconductor transporting and testing fixture that is capable of completely preventing the IC from dropping off the semiconductor transporting and testing fixture during the transportation process, but also of eliminating a necessity of narrowing the pitch of the testing socket for the preliminary testing even in a case that semiconductor transporting and testing fixture is applied to the GBA type semiconductor having a narrow pitch of 0.5 mm or shorter.

DESCRIPTION OF EMBODIMENTS

Hereinafter, embodiments of the present invention will be explained about cases in which the external connection terminal of the IC is constituted by BGA (a solder ball). However the present invention can be applied as well to the cases in which the external connection terminal of the IC is constituted by LGA (a plane electrode pad).

(First Embodiment)

Figure 1:
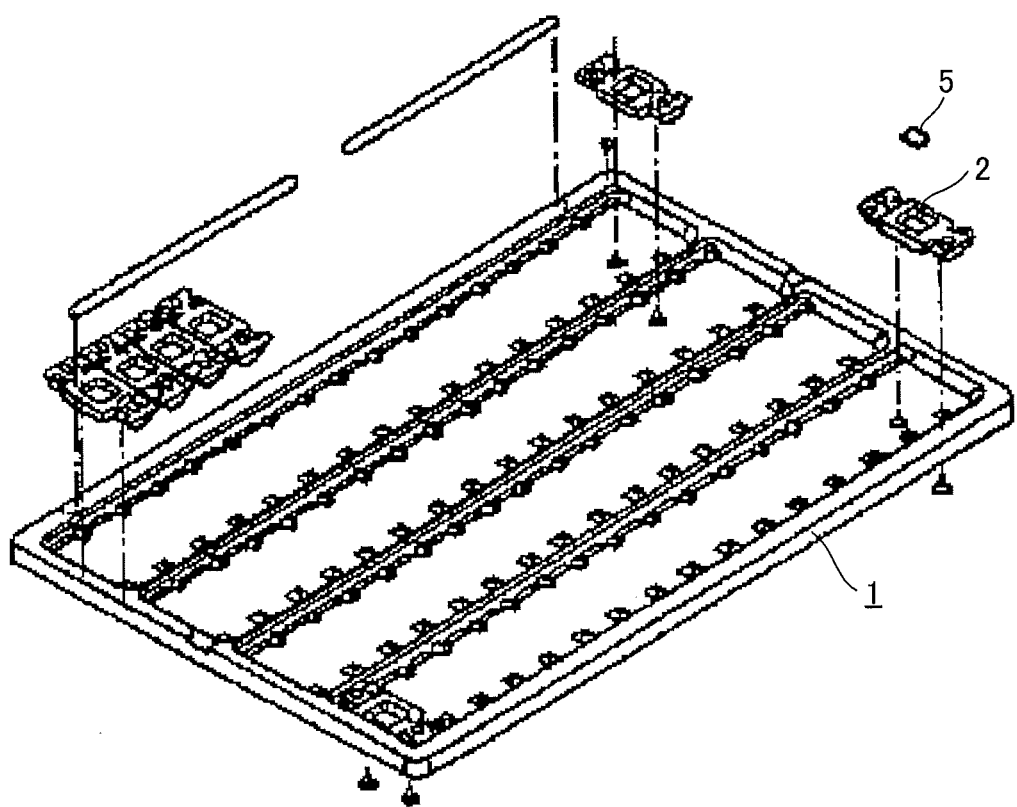
FIG. 1 is a perspective view showing a semiconductor transporting and testing fixture according to the present invention mounted on the transportation framework.

FIG. 1 is a perspective view showing a semiconductor transporting and testing fixture according to the present invention mounted on the transportation framework. A transportation framework 1 made of aluminum has a plurality of (for example, 8×4) mounting portions, each of which is fixed by a screw with a semiconductor transporting and testing fixture 1 having an IC 5 received therein.

Figure 2A:
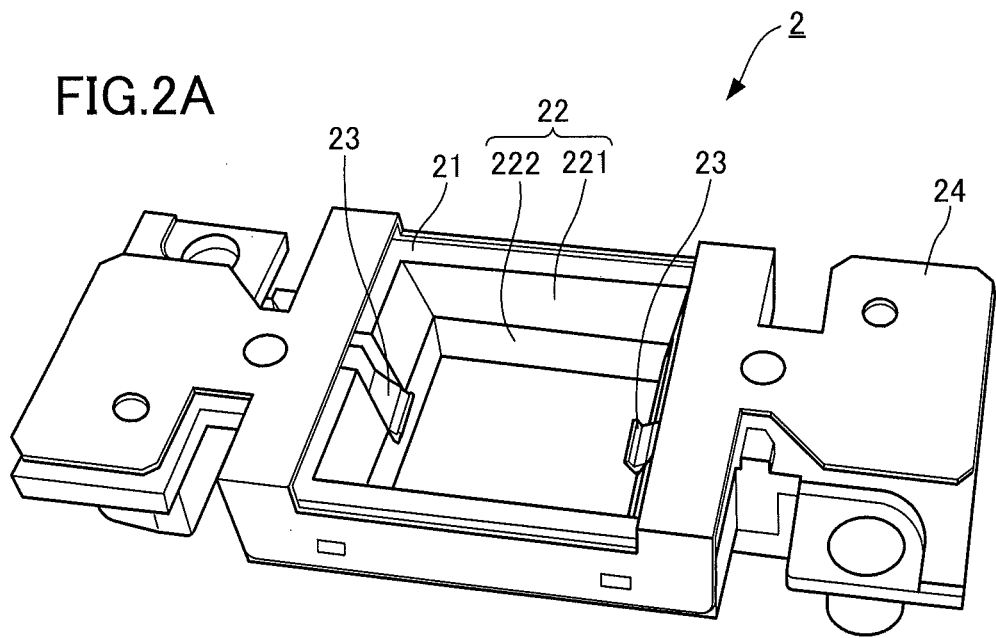
FIG. 2A is an upper perspective view showing the semiconductor transporting and testing fixture according to the present invention.
Figure 2B:
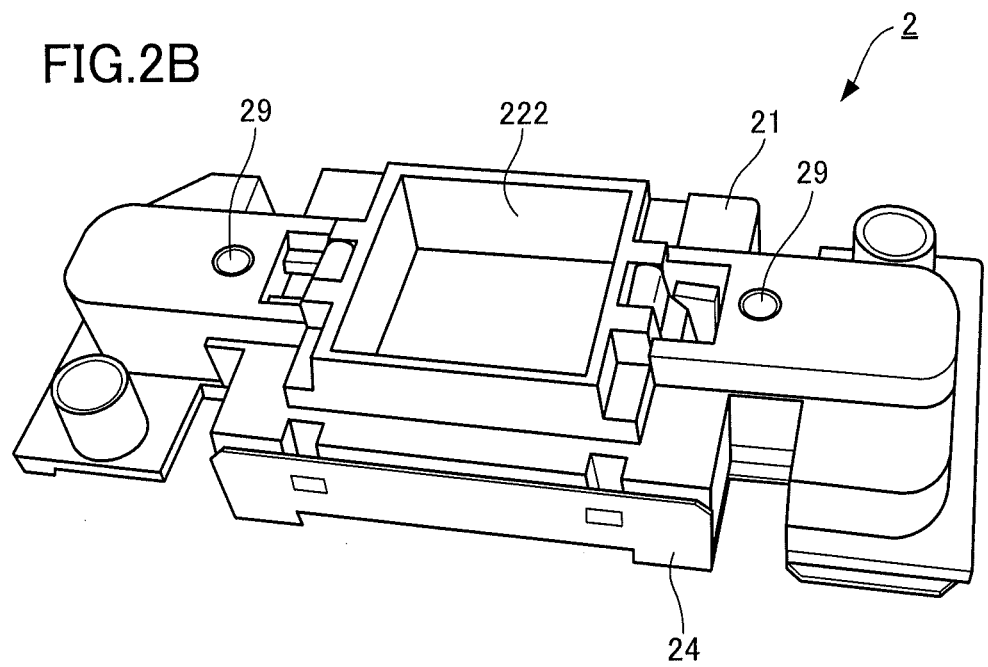
FIG. 2B is a lower perspective view showing the semiconductor transporting and testing fixture according to the present invention.

FIG. 2A is an upper perspective view showing the semiconductor transporting and testing fixture according to the present invention, while FIG. 2B is a lower perspective view showing the semiconductor transporting and testing fixture according to the present invention. A resin frame portion 21 of the semiconductor transporting and testing fixture 2 is constructed to form a hollow portion in which the IC 5 is received. An inner peripheral wall 22 of the frame portion 21 is constituted by an inclined wall 221 and a perpendicular wall 222. The inclined wall 221 is inclined to have its opening gradually increase in an upward direction, so that the IC 5 is easily received in the hollow portion, while the perpendicular wall 222 is formed to surround a side of the IC 5 apart therefrom by a gap (for example 0.1 mm or shorer).

Further, at least in one position of the inclined wall 221 is formed a retaining latch 23 protruding therefrom toward above the IC 5 when the IC 5 is received inside the perpendicular wall 222. The retaining latch 23 is constructed to be pulled inside the inclined wall 221 in response to pressing down an operation plate 24 covering an upper surface of the frame portion 21, thereby making it possible to have the IC5 received in the inner peripheral wall 22.

To be more specific, the operation plate 24 is pressed down to have the retaining latch 23 pulled inside the inclined wall 221, when the IC 5 is received by the semiconductor transporting and testing fixture 2. Then, insert the IC5 along the inclined wall 221 to have the IC 5 received inside the perpendicular wall 222. After thus inserting the IC 5, the operation plate 24 is released from being pressed down, in response to which the retaining latch 23 is protruded from the inclined wall 221 toward above the IC 5. By the construction as set forth above, the IC 5 is prevented from dropping off the semiconductor transporting and testing fixture 2 during the transportation process.

Figure 3:
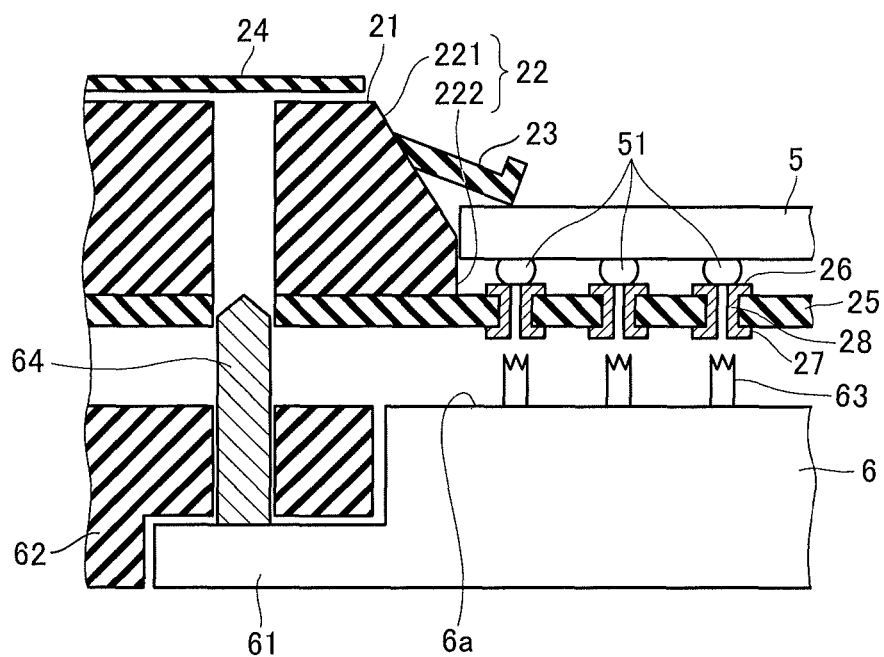
FIG. 3 is a partial sectional view showing the semiconductor transporting and testing fixture according to the first embodiment of the present invention and the testing socket for preliminary testing before being fitted with each other.

FIG. 3 is a partial sectional view showing the semiconductor transporting and testing fixture according to the first embodiment of the present invention and the testing socket for preliminary testing before being fitted with each other. Here, the testing socket for preliminary testing can be constituted by a known testing socket for preliminary testing, so that the description of the cross sectional structure of the testing socket for preliminary testing is omitted.

The semiconductor transporting and testing fixture 2 has its bottom surface covered by a bottom surface sheet 25 pasted on a lower surface of the frame portion 21, so that the IC5 is prevented from dropping off from the bottom surface of the semiconductor transporting and testing fixture 2. The bottom surface sheet 25, pasted on the lower surface of the frame portion 21 by an adhesive, is so constructed to be replaceable in a case that the bottom surface sheet 25 is damaged.

The bottom surface sheet 25 has an IC side pad (a first pad) 26 formed on a front surface thereof and a socket side pad (a second pad) 27 formed on a rear surface thereof, the IC side pad 26 being contactable with a solder ball 51 arranged on a lower surface of the IC 5, the socket side pad 27 being contactable with a contact pin protruding upward from the testing socket for preliminary testing. In pasting the bottom surface sheet 25 on the lower surface of the frame portion 21, a position of the IC side pad 26 must be determined with a precision of at least the gap between the IC 5 and the perpendicular wall 222.

Figure 4:
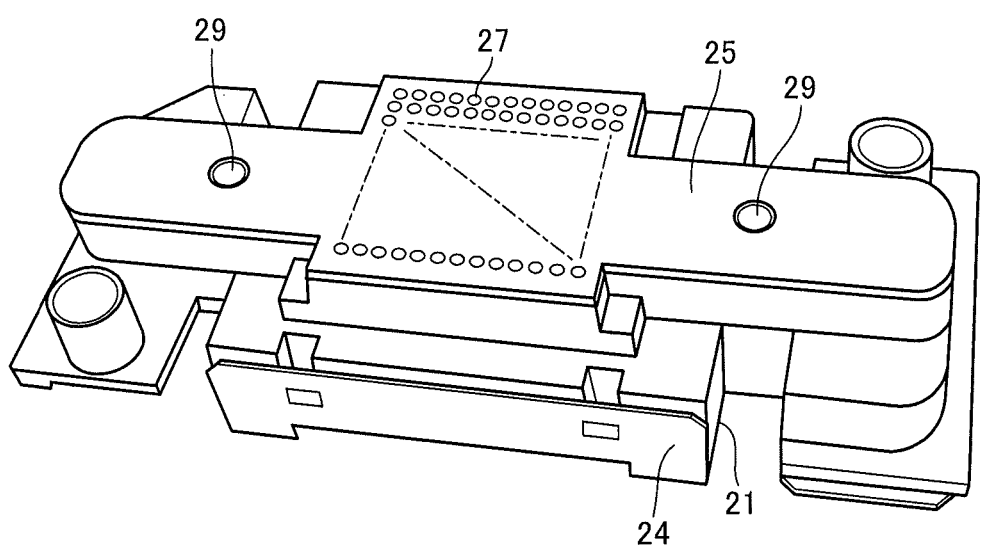
FIG. 4 is a lower perspective view showing the semiconductor transporting and testing fixture having a bottom surface sheet pasted thereon.

FIG. 4 is a lower perspective view showing the semiconductor transporting and testing fixture having the bottom surface sheet pasted thereon. The bottom surface sheet 25 and the frame portion 21 of the semiconductor transporting and testing fixture 2 respectively have at least two positioning holes 29 formed therein.

When the IC 5 is inserted from above the semiconductor transporting and testing fixture 2 at while the operation plate 24 is being pressed down to have the retaining latch 23 pulled inside the inclined wall 221, the IC 5 is guided along the inclined wall 221, thereby having the IC 5 reached down to a section surrounded by the perpendicular wall 222 and the bottom surface sheet 25.

The gap between the side of the IC 5 and the perpendicular wall 222 is set extremely narrow (for example, 0.1 mm or shorter), so that the solder ball 51 arranged on the lower surface of the IC 5 comes into a secure contact with the IC side pad 26 formed on the upper surface of the bottom surface sheet 25.

The IC side pad 26 formed on the upper surface of the bottom surface sheet 25 and the socket side pad 27 formed on the lower surface of the bottom surface sheet 25 are electrically connected with each other through a conduction path 28 perpendicularly penetrating the bottom surface sheet 25.

The testing socket 6 for preliminary testing is secured to a substrate (not shown), by a fixation member 62 pressing downward a baseboard 61, forming part of the testing socket 6, toward the substrate. The testing socket 6 for preliminary testing has a contact pin 63 rising from an upper surface 6a, and a positioning pin 64 rising from the baseboard 61 of the testing socket 6, the positioning pin 64 penetrating through the fixation member 62.

The semiconductor transporting and testing fixture 2 with the IC 5 received therein is transferred to a position above the testing socket 6. Then, the positioning hole 29, formed in the bottom surface sheet 25 and the frame portion 21 of the semiconductor transporting and testing fixture 2, is adapted to have fit therein the positioning pin 64, thereby to have the socket side pad 27 and the contact pin 63 brought into a secure contact with each other. As a result, the IC 5 and the IC tester (not shown) are electrically connected with each other.

In the present embodiment, the socket side pad 27 is positioned right beneath the IC side pad 26, so that it is necessary to have an arrangement pattern of the contact pins 63 of the testing socket 6 for preliminary testing the same with an arrangement pattern of the solder balls 51, Further, the bottom surface sheet 25 is preferably made of a flexible polymer film such as polyester and polyimide, so that the bottom surface sheet 25 is flexibly deformed in response to a pressure applied thereto, when the IC side pad is brought into contact with the solder ball 51 and when the socket side pad is brought into contact with the contact pin 63.

Figure 5A:
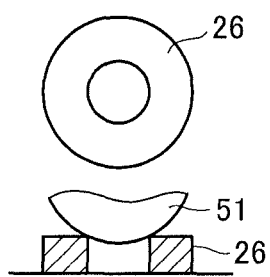
FIGS. 5A to 5C respectively show a top view (top part) and a lateral sectional views (bottom part) of an IC side pad.
Figure 5B:
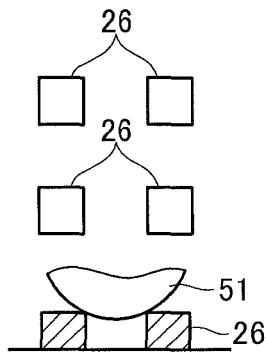
Figure 5C:
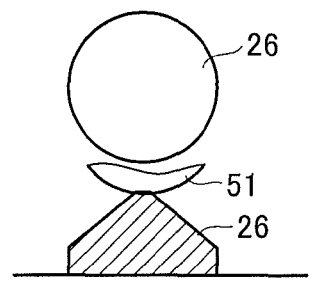

FIGS. 5A to 5C respectively show a top view (top part) and a lateral sectional views (bottom part) of the IC side pad 26. The IC side pad 26, as shown in FIGS. 5A to 5C, is desirably shaped in a ring shape (FIG. 5A), a segmented shape (FIG. 5B), a circular shape or a polygonal pyramid shape (FIG. 5C), so that the IC side pad 26 is brought into a secure contact with the solder ball 51. Here, the segmented shape refers to such a shape that a plurality of pads (terminals) are arranged at regular intervals on a circumference of a circle having a diameter shorter than a maximum diameter of the solder ball 51. FIG. 5B shows a case that four right rectangular pads (terminals) are arranged.

(Second Embodiment)

Figure 6:
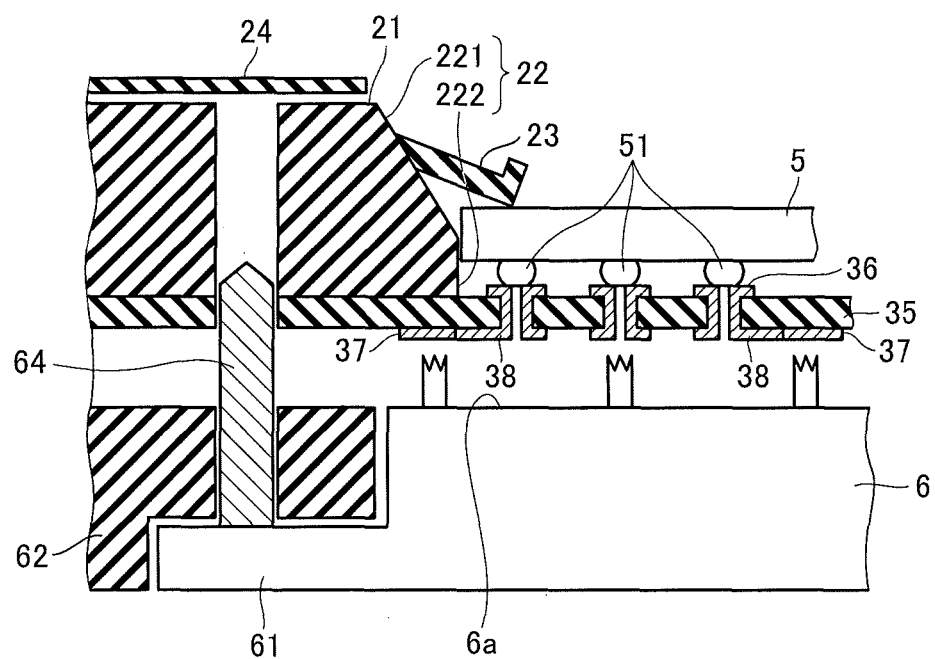
FIG. 6 is a partial sectional view showing the semiconductor transporting and testing fixture according to the second embodiment of the present invention and the testing socket for preliminary testing before being fitted with each other.

FIG. 6 is a partial sectional view showing a semiconductor transporting and testing fixture according to the second embodiment of the present invention and the testing socket for preliminary testing, only differing from the first embodiment in the construction of the bottom surface sheet. To be more specific, the arrangement pattern of IC side pads 36 arranged on the upper surface of the bottom surface sheet and the arrangement pattern of socket side pads 37 arranged on the lower surface of the bottom surface sheet are different from each other in a bottom surface sheet 35 in the second embodiment.

For this reason, a conduction passage 38, having the IC side pad 36 connected with the socket side pad 37, perpendicularly penetrates the bottom surface sheet 35 from right beneath the IC side pad 36 to a lower surface of the bottom surface sheet 35, and then horizontally extends along the lower surface of the bottom surface sheet 35 to reach up to the socket side pad 37. According to the present embodiment, an arrangement interval of contact pins 63 of the testing socket 6 for preliminary testing can be extended longer than an arrangement interval of the solder balls 51 of the IC 5, thereby making it possible to suppress a manufacturing cost of the testing socket 6 for preliminary testing. Since the other constructions in the present embodiment are the same as in the first embodiment, the description thereof is omitted.

(Third Embodiment)

Figure 7:
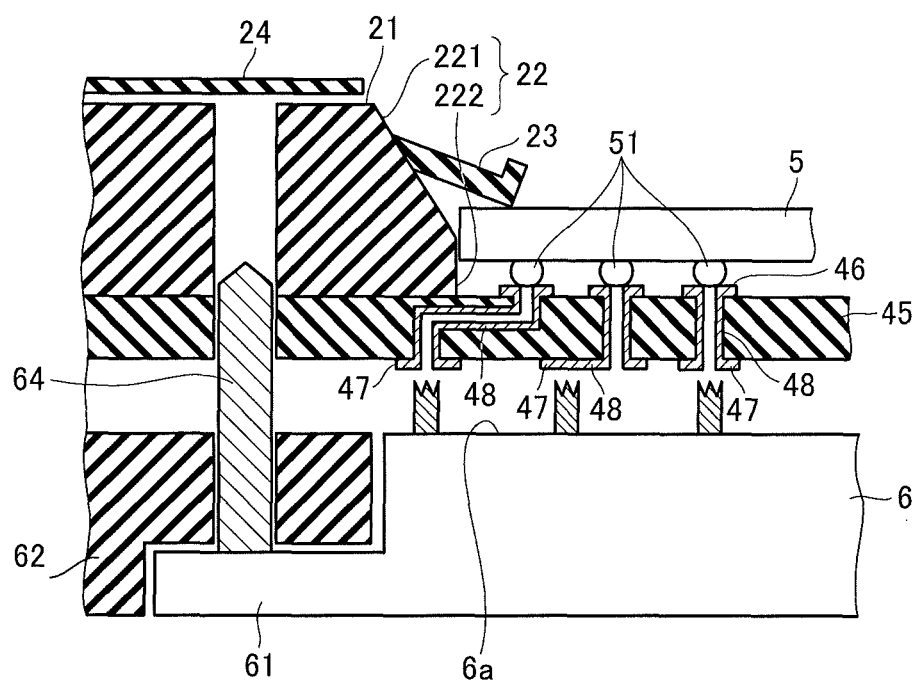
FIG. 7 is a partial sectional view showing the semiconductor transporting and testing fixture according to the third embodiment of the present invention and the testing socket for preliminary testing before being fitted with each other.

FIG. 7 is a partial sectional view showing a semiconductor transporting and testing fixture according to the third embodiment of the present invention and the testing socket for preliminary testing, wherein a multi-layer sheet is employed as the bottom surface sheet. To be more specific, a conduction passage 48, having an IC side pad 46 connected with a socket side pad 47, is horizontally extended inside a multi-layer bottom surface sheet 45. According to the present embodiment, an arrangement interval of contact pins 63 of the testing socket 6 for preliminary testing can be further extended longer than an arrangement interval of the solder balls 51 of the IC 5, thereby making it possible to further suppress a manufacturing cost of the testing socket 6 for preliminary testing. Since the other constructions in the present embodiment are the same as in the first embodiment, the description thereof is omitted.

INDUSTRIAL APPLICABILITY

The semiconductor transporting and testing fixture according to the present invention can be applicable to transporting and testing a narrow-pitch BGA-type IC, and therefore has industrial applicability.

EXPLANATION OF REFERENCE NUMERALS

1 transportation framework
2 semiconductor transporting and testing fixture
6 testing socket for preliminary testing
4 retainer
5 IC (semiconductor integrated circuit)
21 frame portion
22 inner peripheral wall
23 retaining latch
24 operation plate
25, 35, 45 bottom surface sheet
26, 36, 46 IC side pad (first pad)
27, 37, 47 socket side pad (second pad)
28, 38, 48 conduction passage
29 positioning hole
64 positioning pin
63 contact pin
51 solder ball
221 inclined wall
222 perpendicular wall

The invention claimed is:

1. A semiconductor transporting and testing fixture, comprising:
a frame portion adapted to receive therein a semiconductor integrated circuit having an external connection terminal, the frame portion having an inner peripheral wall;
a bottom surface sheet pasted on a bottom surface of the frame portion, the bottom surface sheet having a first pad formed on a front surface thereof and a second pad formed on a rear surface thereof, the first pad being adapted to contact the external connection terminal, the second pad electrically connected with the corresponding first pad and being adapted to contact a testing socket, in which
the frame portion is provided with a retaining latch protruding therefrom toward above the semiconductor integrated circuit when the semiconductor integrated circuit is received in the inner peripheral wall of the frame portion,
the bottom surface sheet is formed in a multi-layer structure and has arranged therein a conduction passage having the first pad and the second pad connected with each other, the conduction passage being horizontally extended inside the bottom surface sheet.

2. The semiconductor transporting and testing fixture as set forth in claim 1, in which the bottom surface sheet is made of a material having flexibility.

3. The semiconductor transporting and testing fixture as set forth in claim 1, in which the first pad and the second pad are different from each other in an arrangement pattern.

4. The semiconductor transporting and testing fixture as set forth in claim 1, in which each of the frame portion and the bottom surface sheet has a positioning hole formed thereon, the positioning hole being adapted to have fit therein a positioning pin which is disposed at a predetermined position of the testing socket.

5. The semiconductor transporting and testing fixture as set forth in claim 1, in which each of the first pads is formed in a shape selected from among a ring shape, a segmented shape, a circular shape and a polygonal pyramid shape.

* * * * *